US011595073B2

(12) United States Patent
Balmer

(10) Patent No.: US 11,595,073 B2
(45) Date of Patent: *Feb. 28, 2023

(54) MULTI-CONFIGURATION CLAMP SYSTEM FOR ELECTRONIC DEVICE

(71) Applicant: Vitec Holdings Italia SRL, Cassola (IT)

(72) Inventor: Noah Balmer, Santa Rosa, CA (US)

(73) Assignee: Vitec Imaging Solutions S.P.A., Cassola (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/865,795

(22) Filed: May 4, 2020

(65) Prior Publication Data

US 2021/0083707 A1 Mar. 18, 2021

Related U.S. Application Data

(63) Continuation of application No. 16/116,925, filed on Aug. 30, 2018, now Pat. No. 10,644,740.

(51) Int. Cl.
*H04B 1/3827* (2015.01)
*H04B 1/3877* (2015.01)
(Continued)

(52) U.S. Cl.
CPC ............ *H04B 1/385* (2013.01); *A45F 5/00* (2013.01); *A45F 5/021* (2013.01); *A45F 5/10* (2013.01); *F16B 2/12* (2013.01); *F16M 11/041* (2013.01); *F16M 11/10* (2013.01); *F16M 11/2021* (2013.01); *F16M 11/242* (2013.01);
(Continued)

(58) Field of Classification Search
CPC .... A45F 5/021; A45F 5/10; A45F 2200/0508; A45F 2200/0516; A45F 2200/0525; H04B 1/385; H04B 1/3877; H04B 2001/3855; H04B 2001/3861; F16B 2/12; F16M 11/041; F16M 11/10; F16M 11/2021; F16M 11/242; F16M 11/40; F16M 13/04; H04M 1/0202; H04M 1/04; H04M 1/0264; H05K 5/023
See application file for complete search history.

(56) References Cited

U.S. PATENT DOCUMENTS 3,140,558 A * 7/1964 Cassidy ............... A47B 23/043
248/452
8,770,539 B1 * 7/2014 Hsu ..................... B60R 11/0229
248/688

(Continued)

*Primary Examiner* — Dean J Kramer
(74) *Attorney, Agent, or Firm* — Michael A. Guth

(57) ABSTRACT

A support system which allows for the use and mounting of a smart phone, or similar electronic device, in a variety of ways. The support system may be adapted to function as a hand grip while supporting the smart phone during image acquisition, or while watching images on the smart phone. In another configuration, the support system may be adapted to attach to the user's belt. In another configuration, the support system may function as a support stand. In another configuration, the support system may be mounted on a tripod. The support system may include a kit of parts which allow for the modification of support accessories to allow for different configurations. The support system may include a removable shutter which may actuate the camera functions via wireless communication.

4 Claims, 19 Drawing Sheets

(51) Int. Cl.
*A45F 5/02* (2006.01)
*A45F 5/10* (2006.01)
*F16B 2/12* (2006.01)
*F16M 11/20* (2006.01)
*F16M 11/04* (2006.01)
*F16M 11/24* (2006.01)
*F16M 11/40* (2006.01)
*H05K 5/02* (2006.01)
*F16M 11/10* (2006.01)
*F16M 13/04* (2006.01)
*H04M 1/04* (2006.01)
*A45F 5/00* (2006.01)
*H04M 1/02* (2006.01)

(52) U.S. Cl.
CPC ............ *F16M 11/40* (2013.01); *F16M 13/04* (2013.01); *H04B 1/3877* (2013.01); *H04M 1/04* (2013.01); *H05K 5/023* (2013.01); *A45F 2005/008* (2013.01); *A45F 2200/0508* (2013.01); *A45F 2200/0516* (2013.01); *H04B 2001/3855* (2013.01); *H04B 2001/3861* (2013.01); *H04M 1/0264* (2013.01)

(56) References Cited

U.S. PATENT DOCUMENTS

| | | | | |
|---|---|---|---|---|
| 9,285,832 | B2* | 3/2016 | Galant | G06F 21/88 |
| D765,646 | S* | 9/2016 | Deng | D14/253 |
| 9,695,977 | B2* | 7/2017 | Blalock | G03B 17/561 |
| 9,890,899 | B2* | 2/2018 | Theis | F16M 13/022 |
| 10,128,887 | B2* | 11/2018 | Balmer | F16M 11/242 |
| 10,644,740 | B2* | 5/2020 | Balmer | H05K 5/023 |
| 2005/0205728 | A1* | 9/2005 | Avery | F16M 11/045 248/316.1 |
| 2011/0219589 | A1* | 9/2011 | Yoneyama | A45D 8/20 24/530 |
| 2012/0218106 | A1* | 8/2012 | Zaima | H04W 4/027 340/540 |
| 2012/0257346 | A1* | 10/2012 | Hulet | G06F 1/166 248/316.4 |
| 2014/0209777 | A1* | 7/2014 | Klemin | F16M 11/10 248/544 |
| 2015/0282343 | A1* | 10/2015 | Downes | F16M 11/041 224/420 |
| 2015/0336495 | A1* | 11/2015 | Maslakow | B60N 3/00 224/401 |
| 2015/0355531 | A1* | 12/2015 | Ben Yehuda | G03B 17/563 396/425 |
| 2016/0165025 | A1* | 6/2016 | Sheu | H04M 1/04 455/557 |

* cited by examiner

MULTI-CONFIGURATION CLAMP SYSTEM FOR ELECTRONIC DEVICE

CROSS-REFERENCE TO RELATED APPLICATIONS

This application is a continuation of U.S. patent application Ser. No. 16/116,925 to Balmer, filed Aug. 30, 2018, which is a continuation of U.S. patent application Ser. No. 15/454,209 to Balmer, filed Mar. 9, 2017, which claims priority to U.S. Provisional Patent Application No. 62/306,589 to Balmer, filed Mar. 10, 2016, which are all hereby incorporated by reference in their entirety.

BACKGROUND

Field of the Invention

This invention relates to mounting systems, and more specifically to a mounting system and a kit relating to same.

SUMMARY

A support system which allows for the use and mounting of a smart phone, or similar electronic device, in a variety of ways. The support system may be adapted to function as a hand grip while supporting the smart phone during image acquisition, or while watching images on the smart phone. In another configuration, the support system may be adapted to attach to the user's belt. In another configuration, the support system may function as a support stand. In another configuration, the support system may be mounted on a tripod. The support system may include a kit of parts which allow for the modification of support accessories to allow for different configurations. The support system may include a removable shutter which may actuate the camera functions via wireless communication.

DETAILED DESCRIPTION

In some embodiments of the present invention, an adjustable clamp is adapted to grip a smart phone or other device. The central clamp portion may comprise two sliding members adapted to slide along an axis in order to vary the length of the clamp. A locking mechanism is adapted to allow the user to set the length by pushing on a tab. The ends of the central clamp portion may extend perpendicular from the extension axis in order to receive and clamp upon a smart phone. There may be softer pads inside the perpendicular extensions to allow for some gripping as the pads are compressed. In some aspects, a remote trigger may be mounted on one of the ends of the central clamp portion. The remote trigger may be used to activate a shutter or otherwise control imaging of the mounted device.

Figure 1:
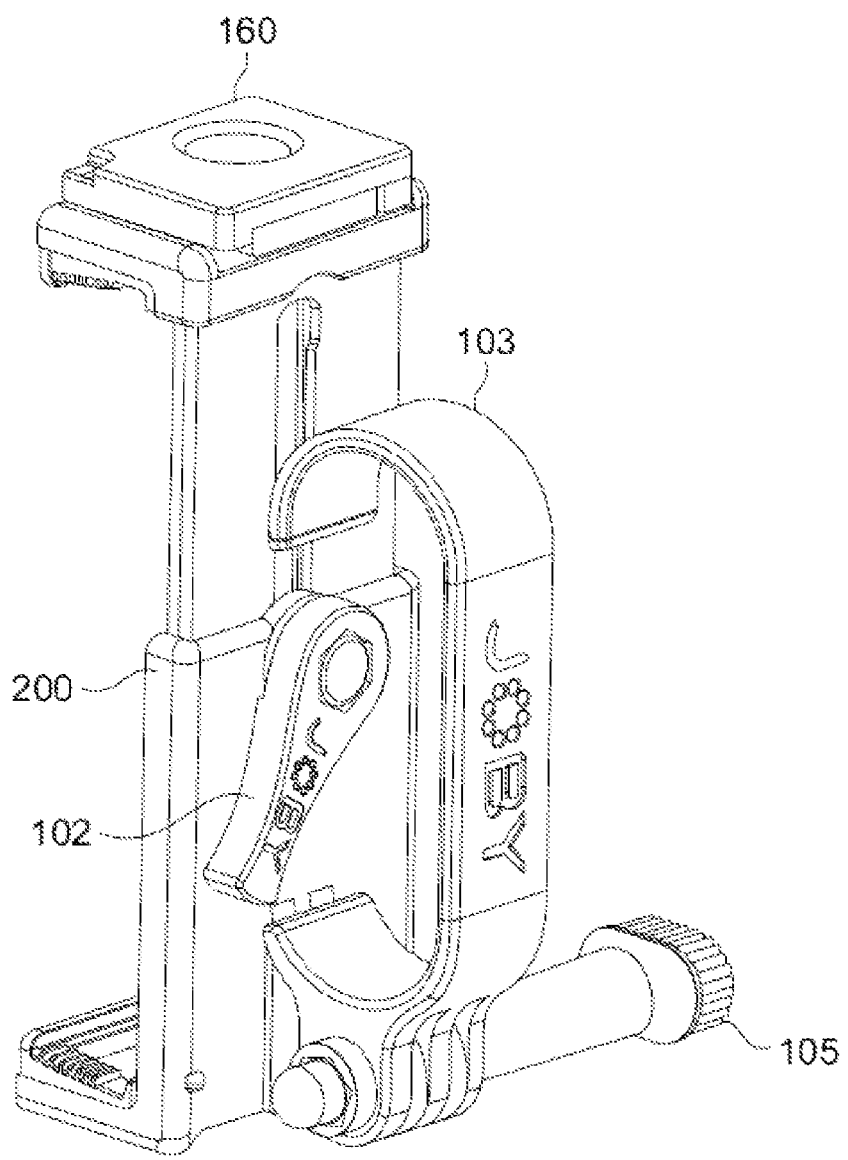
FIG. 1 illustrates a multi-configuration clip system with a hand grip according to some embodiments of the present invention.
Figure 2:
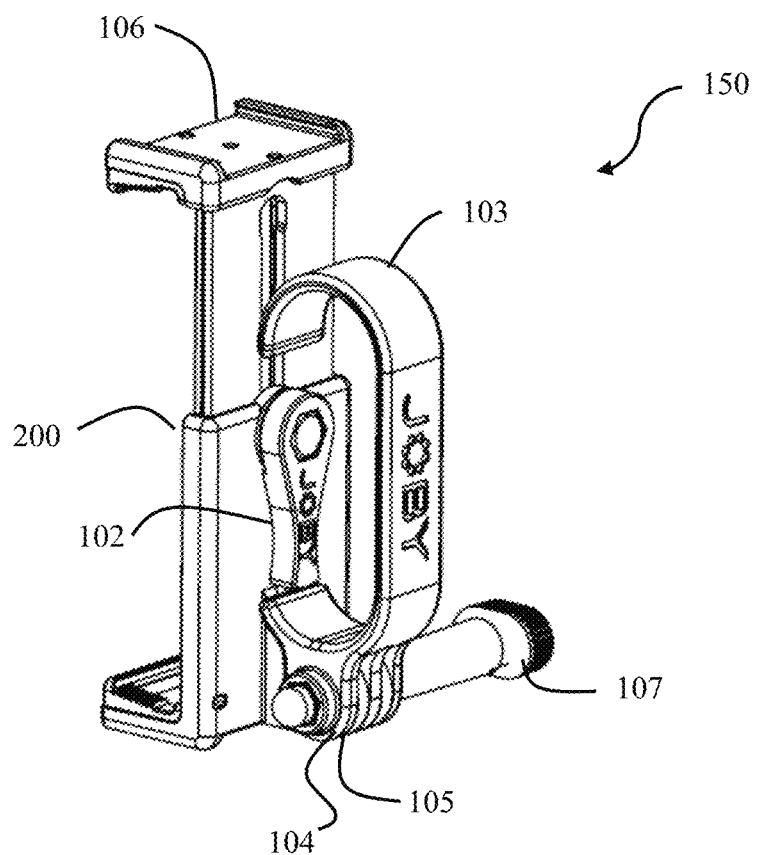
FIG. 2 illustrates a multi-configuration clip system with a hand grip according to some embodiments of the present invention.

As seen in FIGS. 1 and 2, a first configuration 150 of a multi-configuration clamp system includes a central clamp portion 200. The central clamp portion 200 may have interlocking mating pieces adapted to slide along an extension axis to allow for clamping around devices of different cross-sectional dimension. A clamp set lever 102 is adapted to tighten and fasten the two mating pieces of the clamp portion at the desired position. In this first configuration 150 wherein the clamp system is adapted to facilitate hand held operation of a device, a hand grip 103 is coupled to the central clamp portion 200. The central clamp portion 200 has a mounting interface 105. The hand grip 103 also has a mounting interface 104. A clamp mount knob 107 allows for the tightening and fastening of the hand grip 103 to the clamp portion 200. The clamp mount knob 107 may allow for tightening of a threaded feature running cross-wise through the clamp portion mounting interface 105 and the hand grip mounting interface 104. A remote trigger 160 is adapted to fit within a recessed interface 106 on the end of the clamping portion 200 to allow for remote triggering of a camera, or of other functionality.

Figure 3:
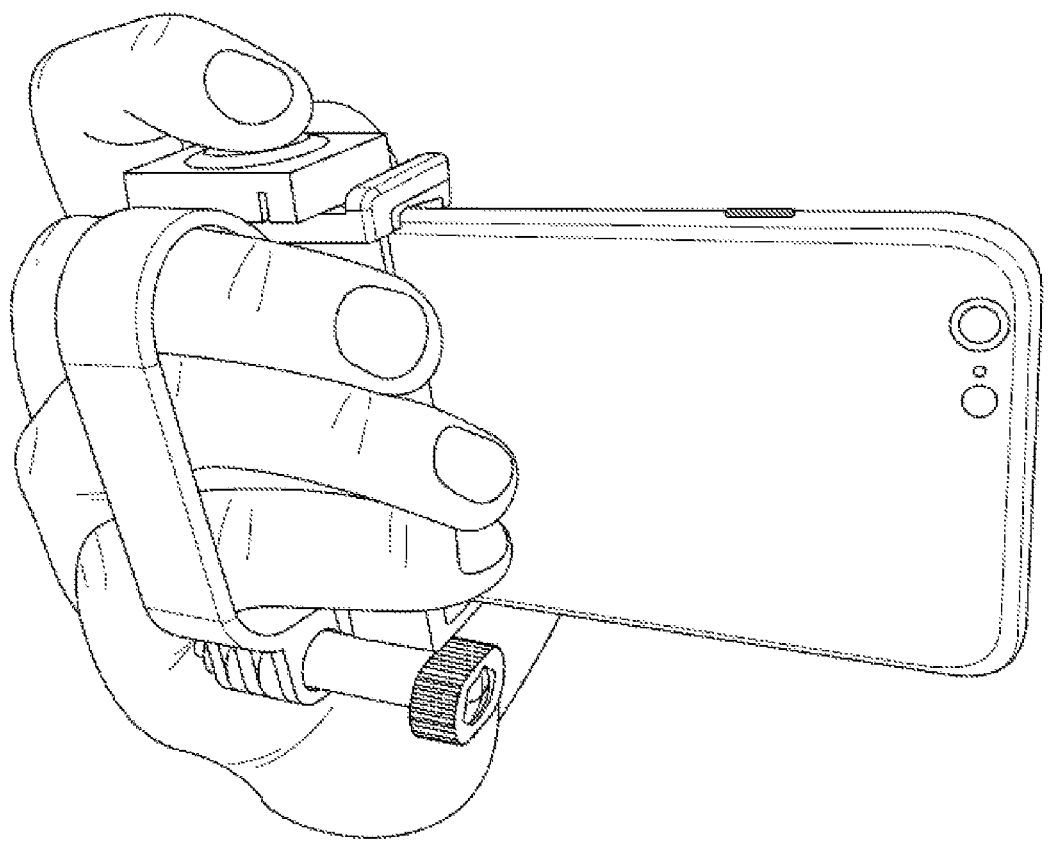
FIG. 3 is a photograph of a user using a multi-configuration clip system with a hand grip according to some embodiments of the present invention.

FIG. 3 illustrates a first configuration 150 of a multi-configuration clamp system while being held by a user. The central clamp portion has been adjusted to a proper dimension to allow the clamp to clasp the smart phone and has been tightened in this position. The slightly resilient pads inside the perpendicular portions of the clamp allow some compression of the pads, enhancing the clasping of the smart phone. The hand grip is in a position up against the back of the clamping portion and has been tightened in this position. As seen, three of the user's fingers are through the hand grip, but the index finger is at the top of the center clamp portion ready to actuate the wireless trigger. As seen, this configuration allows a user to get a much more convenient, useful, and sure grip on the smart phone and also avoids the user having to use another hand to touch the phone to take a picture. The user may trigger the shutter by tapping on the remote trigger, using the same hand that is also holding the phone in the clamp system.

Figure 4:
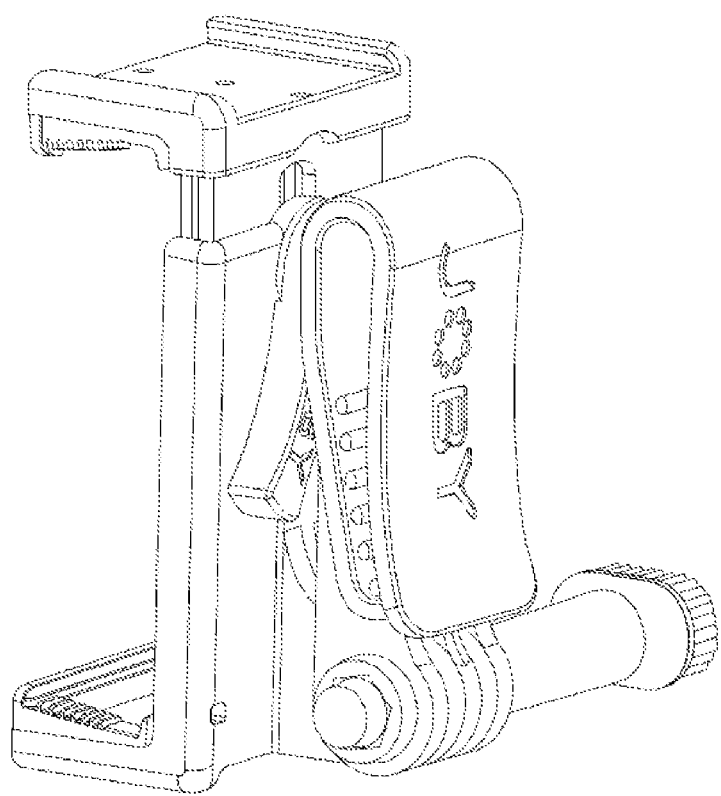
FIG. 4 illustrates a multi-configuration clip system with a belt clip according to some embodiments of the present invention.
Figure 5:
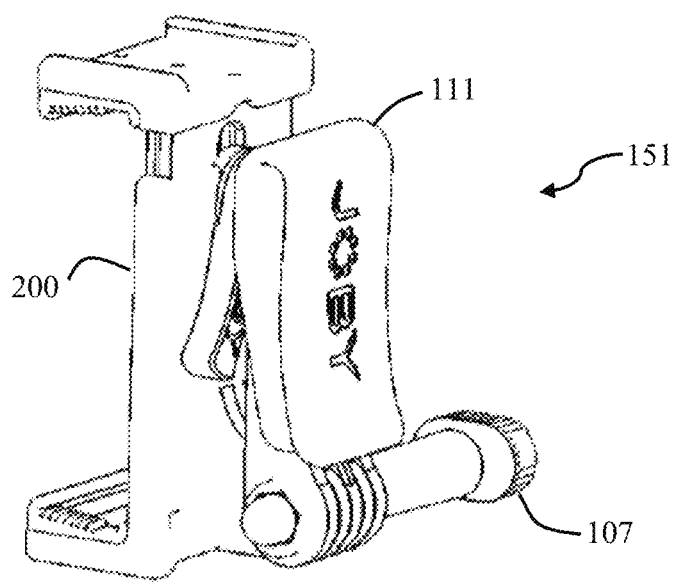
FIG. 5 illustrates a multi-configuration clip system with a belt clip according to some embodiments of the present invention.

As seen in FIGS. 4 and 5, a second configuration 151 of a multi-configuration clamp system includes a central clamp portion 200. The central clamp portion 200 may have interlocking mating pieces adapted to slide along an extension axis to allow for clamping around devices of different cross-sectional dimension. A clamp set lever 102 is adapted to tighten and fasten the two mating pieces of the clamp portion at the desired position. In this second configuration 151 the clamp system is adapted to facilitate belt wearing or standing of a device, a belt clip 111 is coupled to the central clamp portion 200. The central clamp portion 200 has a mounting interface. The belt loop also has a mounting interface 104. A clamp mount knob 107 allows for the tightening and fastening of the belt clip 111 to the clamp portion 200. The clamp mount knob 107 may allow for tightening of a threaded feature running cross-wise through the clamp portion mounting interface 105 and the hand grip mounting interface 104.

Figure 6:
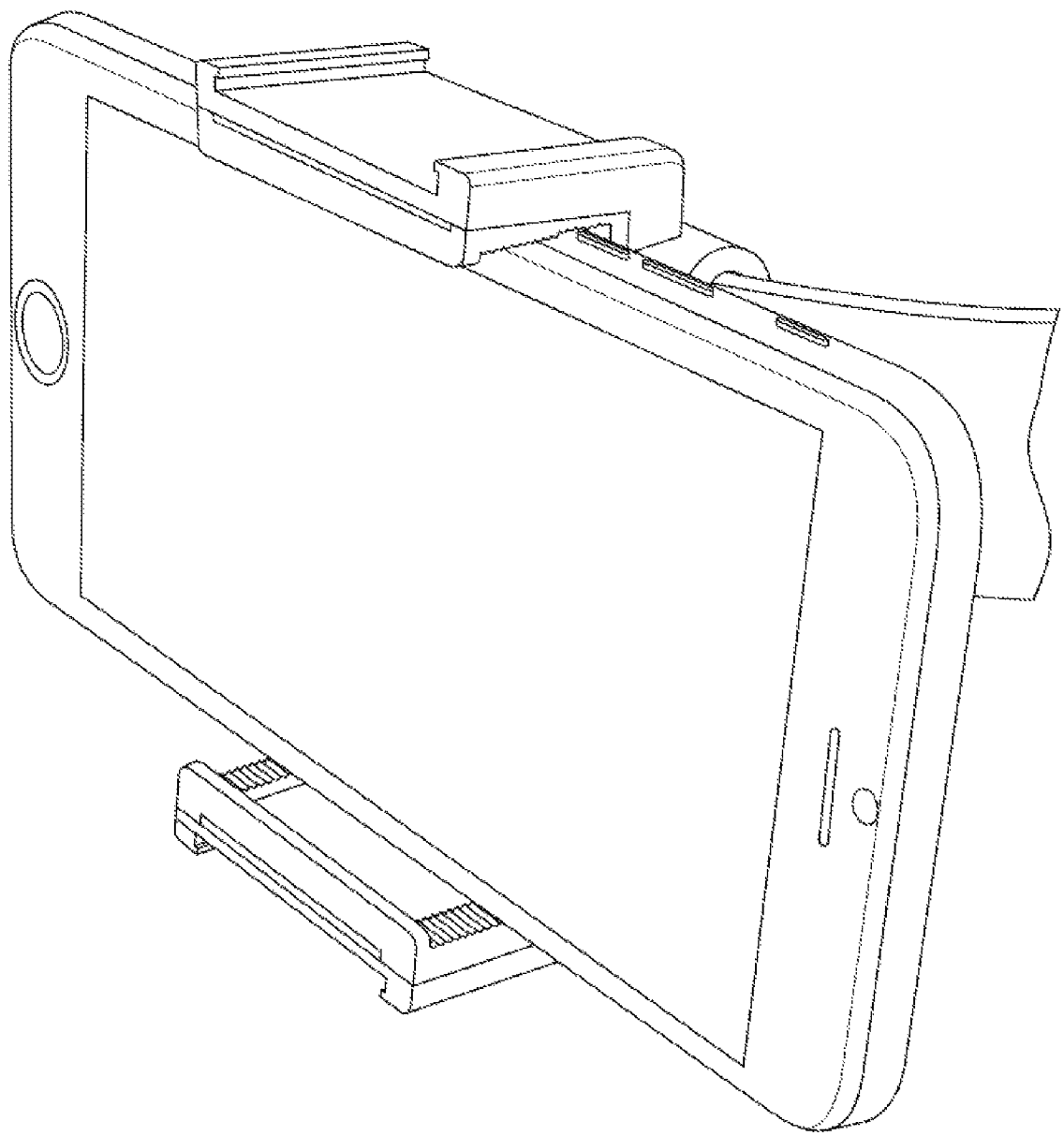
FIG. 6 is a photograph of a user using a multi-configuration clip system with a belt clip according to some embodiments of the present invention.
Figure 7:
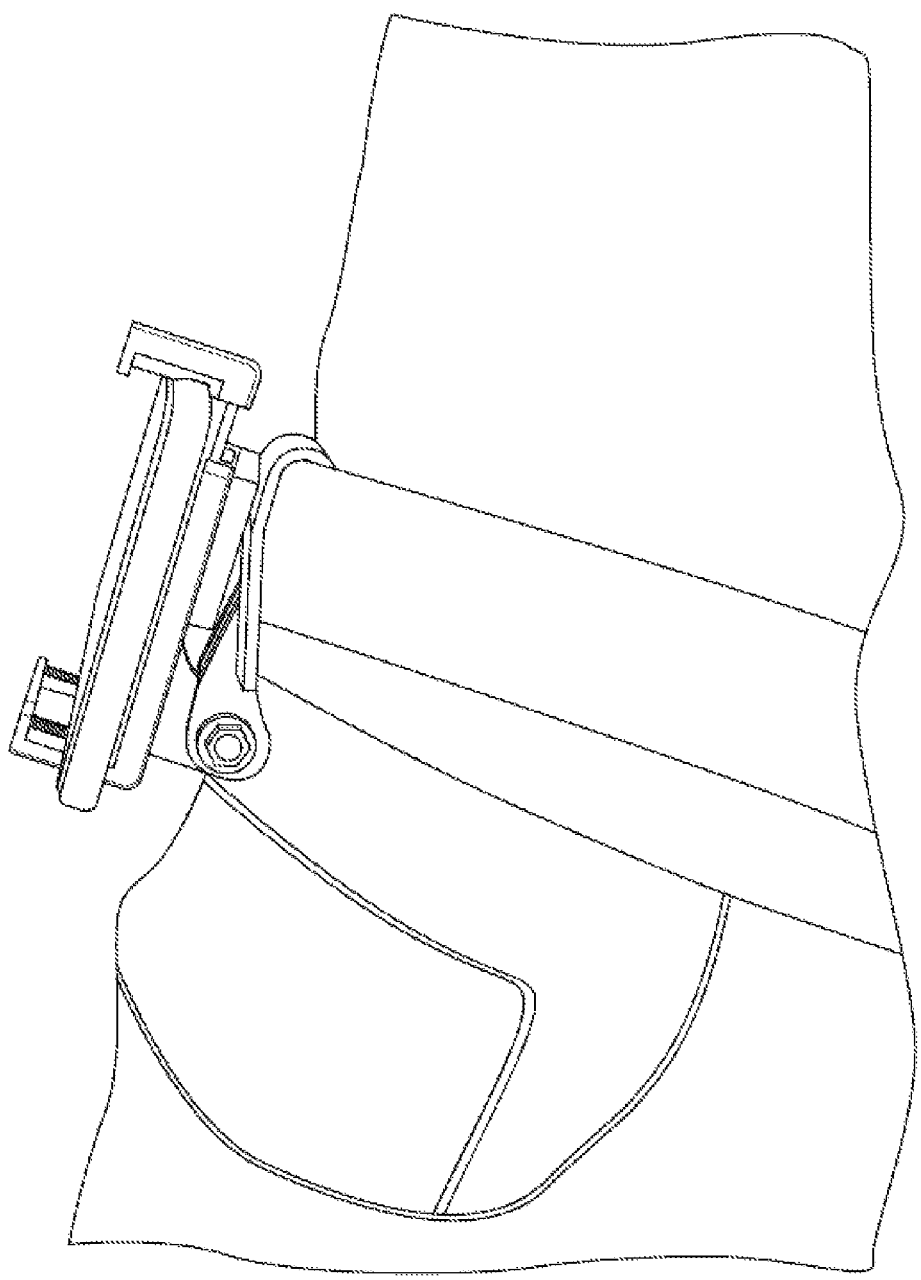
FIG. 7 is a photograph of a user using a multi-configuration clip system with a belt clip according to some embodiments of the present invention.
Figure 8:
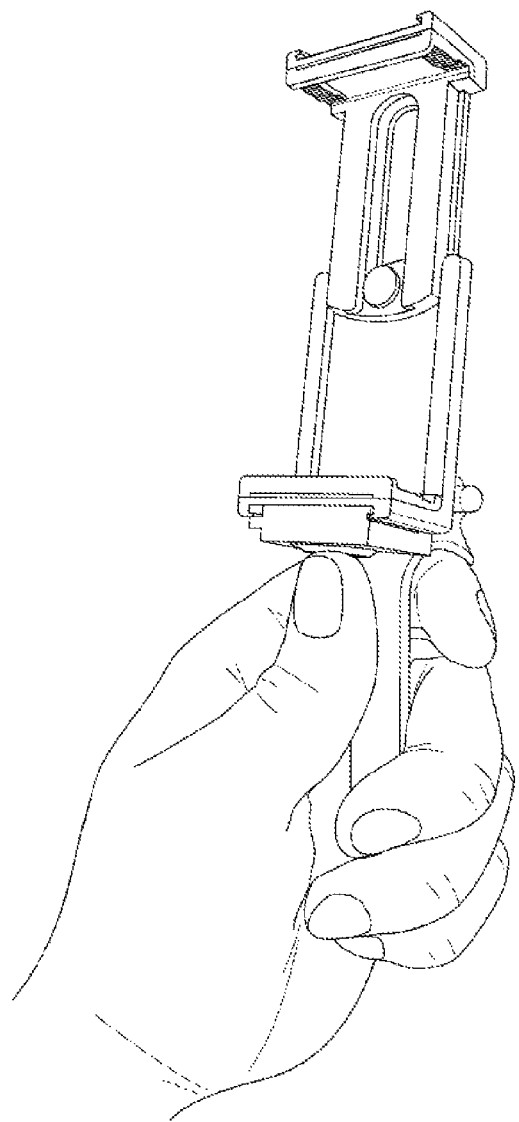
FIG. 8 is a photograph of a user using a multi-configuration clip system in an extended configuration according to some embodiments of the present invention.
Figure 9:
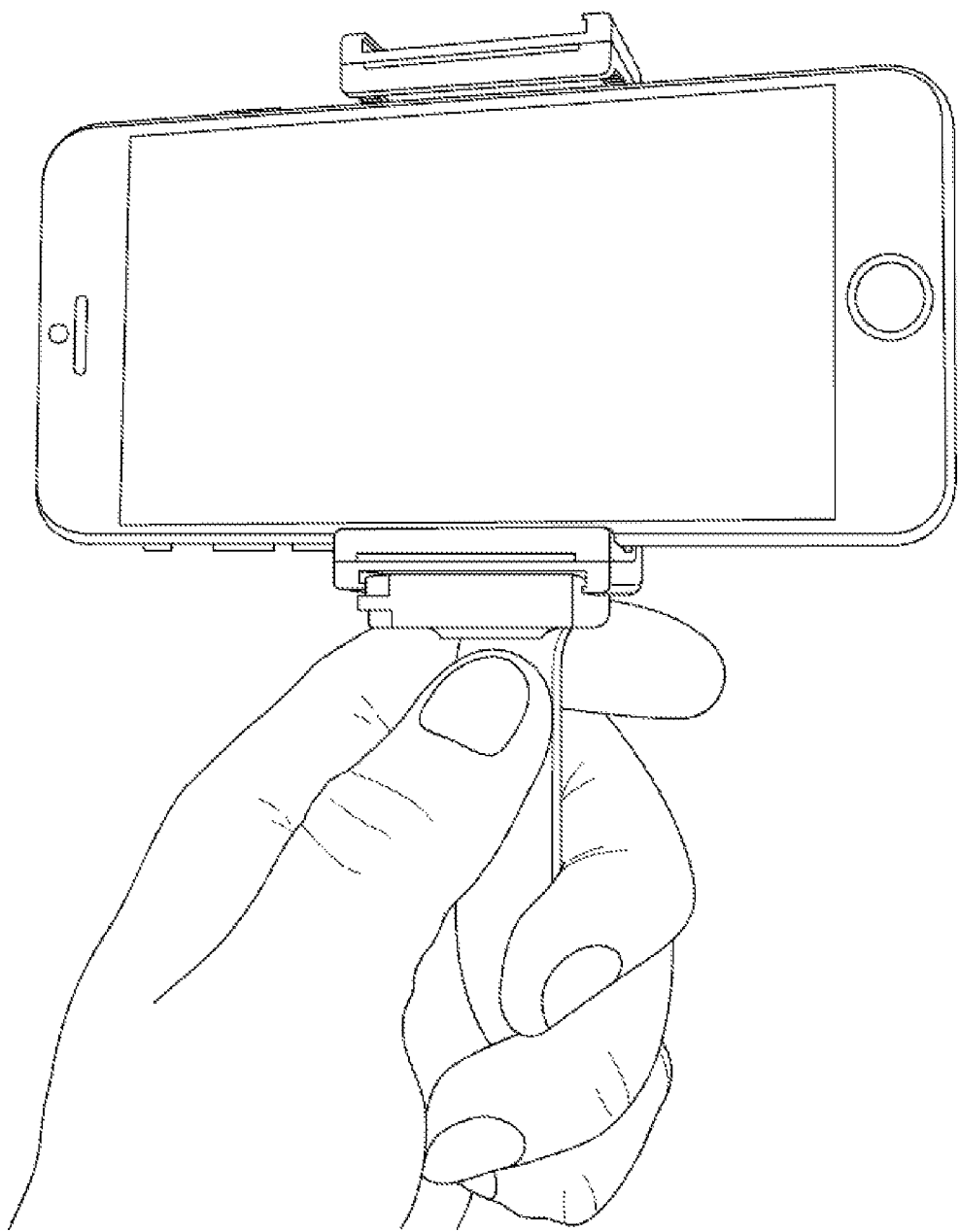
FIG. 9 is a photograph of a user using a multi-configuration clip system in an extended configuration according to some embodiments of the present invention.
Figure 10:
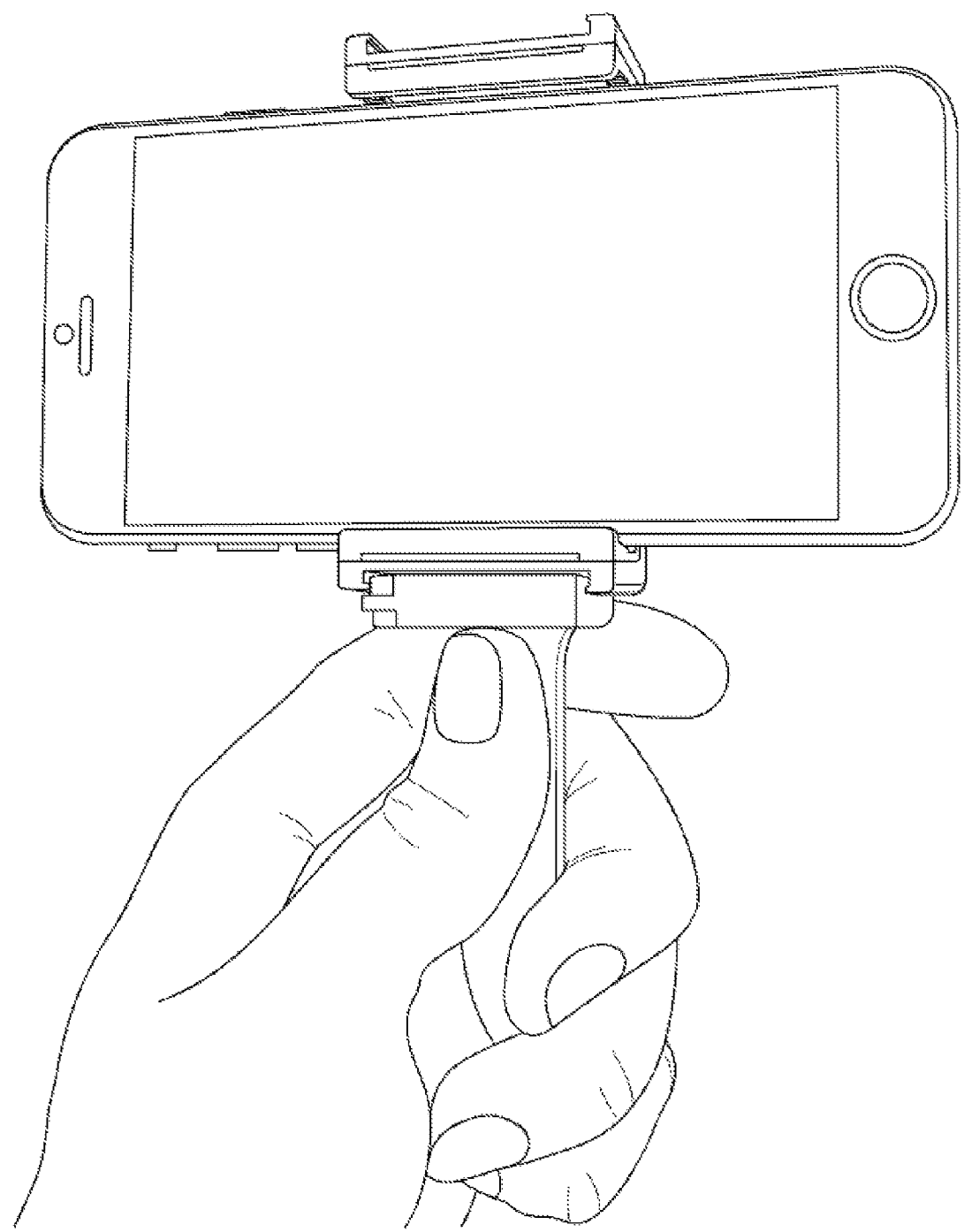
FIG. 10 is a photograph of a user using a multi-configuration clip system actuating the trigger in an extended configuration according to some embodiments of the present invention.
Figure 11:
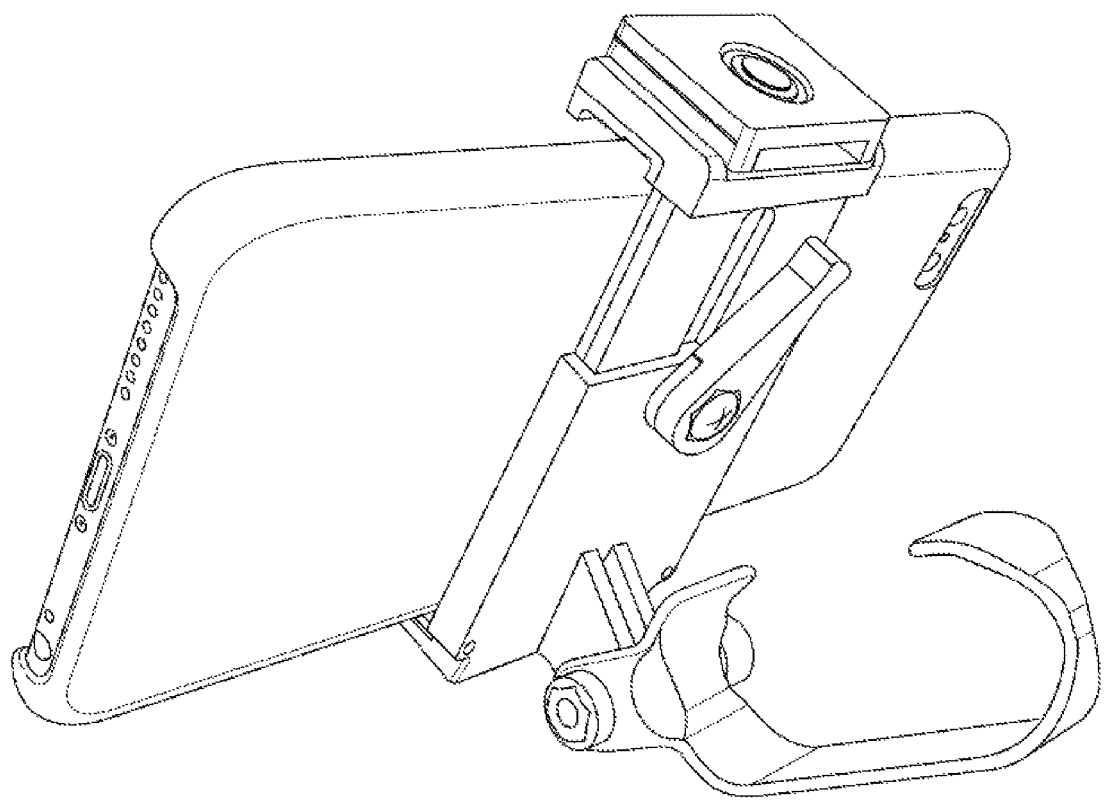
FIG. 11 is a photograph of a multi-configuration clip system in a table top configuration according to some embodiments of the present invention.

FIGS. 6 and 7 illustrate the second configuration 151 of the clamp system gripping a smart phone while being worn on the belt of a user. The belt clip is rotated all the way back against the central clamp portion.

FIG. 8-11 illustrate alternate configurations of the multi-configuration clamp system according to embodiments of the present invention. As seen, the hand grip can be placed and tightened into different positions that allow to be used in different ways.

Figure 12:
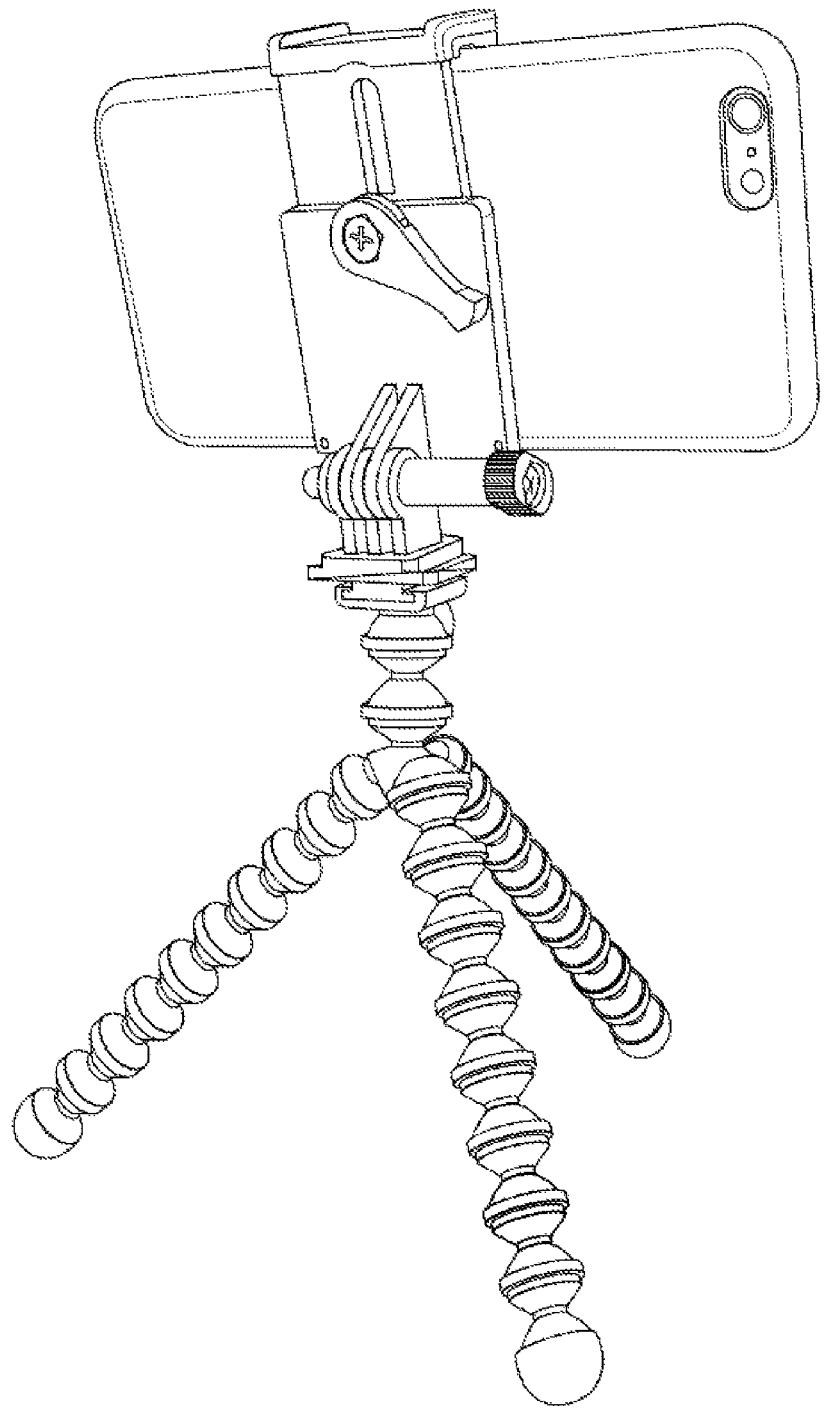
FIG. 12 is a photograph of a multi-configuration clip system on a tripod according to some embodiments of the present invention.
Figure 13:
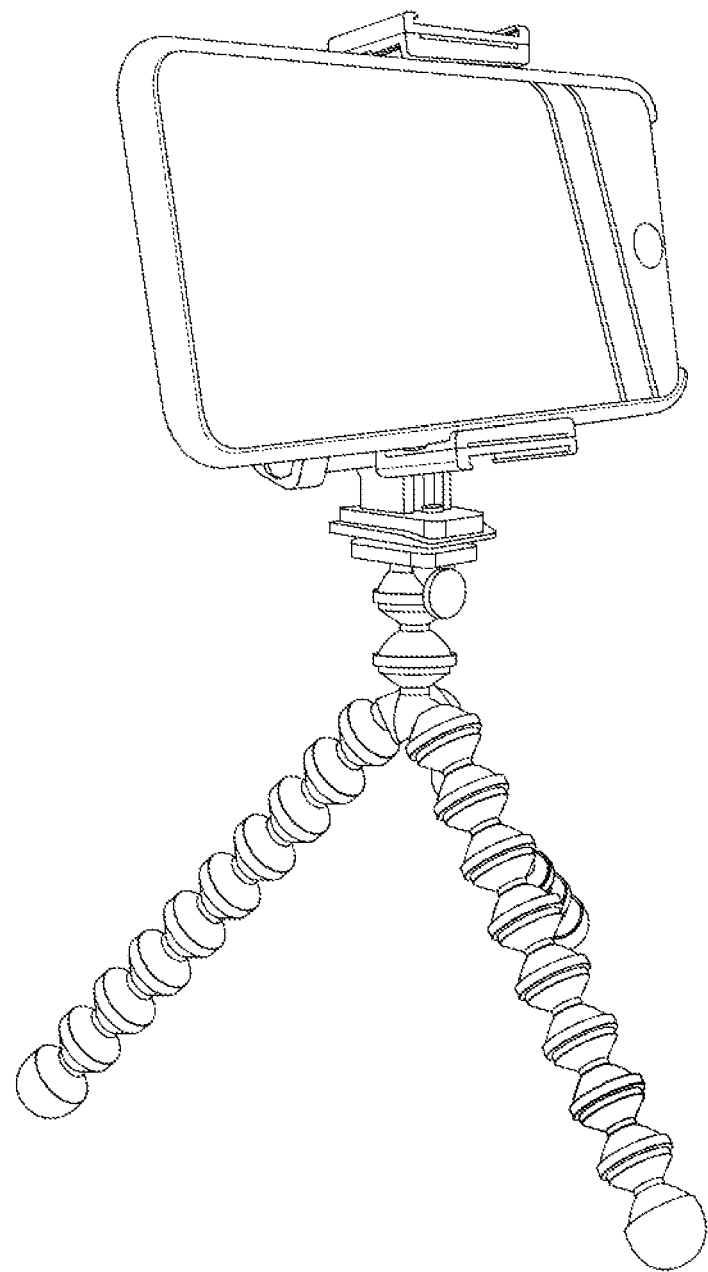
FIG. 13 is a photograph of a multi-configuration clip system on a tripod according to some embodiments of the present invention.
Figure 14:
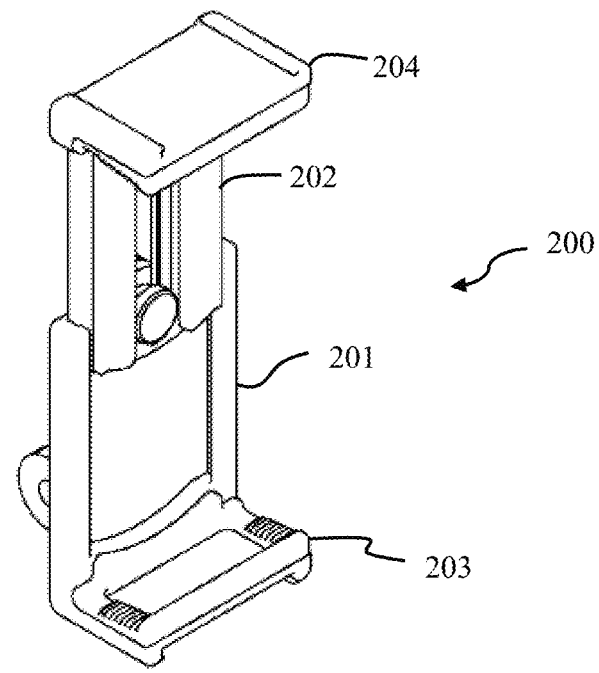
FIG. 14 illustrates a central clip portion of a multi-configuration clip system according to some embodiments of the present invention.
Figure 15:
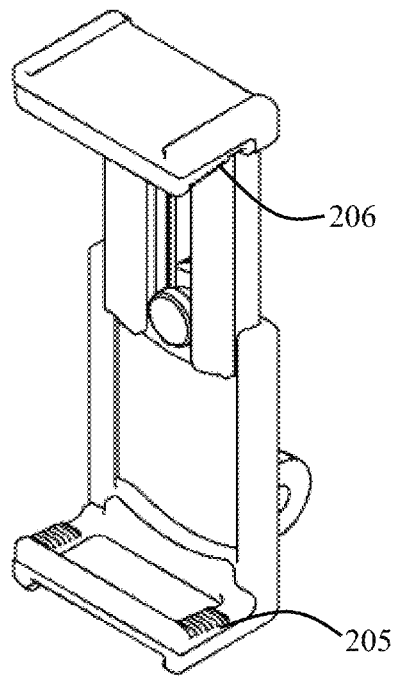
FIG. 15 illustrates a central clip portion of a multi-configuration clip system according to some embodiments of the present invention.
Figure 16:
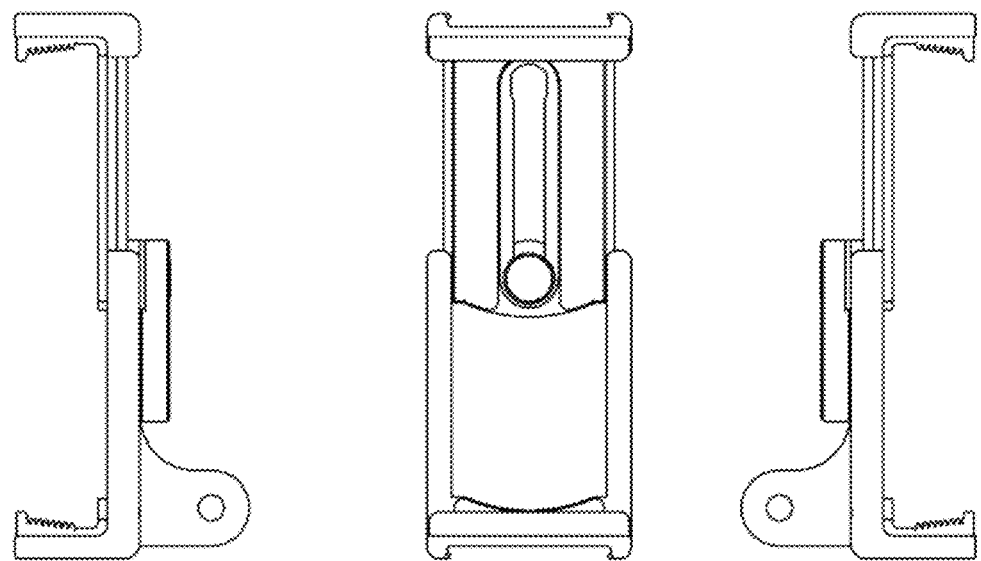
FIG. 16 illustrates a central clip portion of a multi-configuration clip system according to some embodiments of the present invention.
Figure 17:
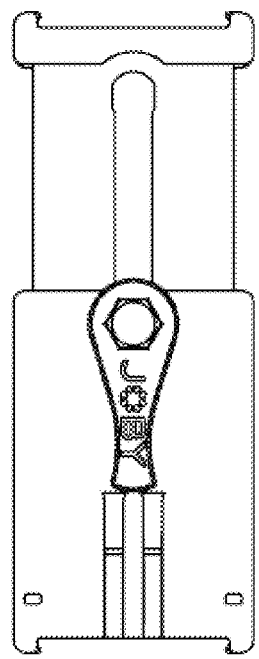
FIG. 17 illustrates a central clip portion of a multi-configuration clip system according to some embodiments of the present invention.

FIGS. 12 and 13 illustrate the clamp system wherein the central clamp portion is coupled to a tripod interface. In this configuration, the smart phone, or other device, may be positioned in any suitable manner that a tripod, or a flexible tripod, may support it.

FIGS. 14-17 illustrate aspects of the central clamp portion 200. A first sliding piece 201 mates with and slides along a second sliding piece 202. The first sliding piece 201 may have a perpendicular gripping end 203 with a resilient portion 205. The second sliding piece 202 may have a perpendicular gripping end 204 with a resilient portion 206. The effective length of the central clamp portion may be adjusted by sliding the two sliding pieces relative to each other. Once a desired location is reached, the clamp lock lever 102 may be pushed rotationally to tighten a threaded element, and firmly lock the two sliding pieces together. Both ends of the central clamp portion may have recesses adapted to receive items such as a remote trigger, or other accessory such as a mounting accessory.

Figure 18:
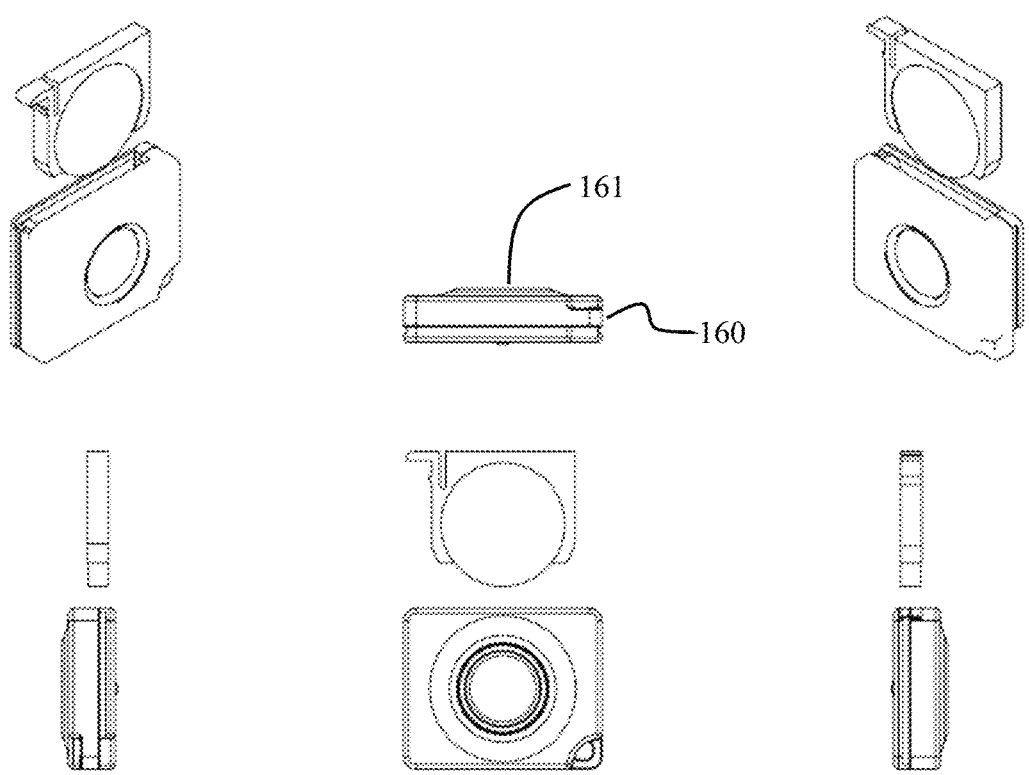
FIG. 18 illustrates a trigger according to some embodiments of the present invention.

FIG. 18 illustrates a remote trigger 160 with a trigger button 161.

Figure 19:
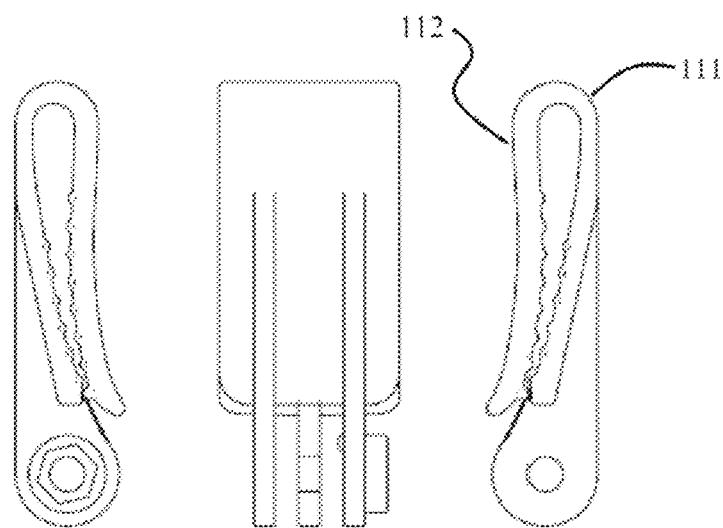
FIG. 19 illustrates a belt clip according to some embodiments of the present invention.
Figure 20:
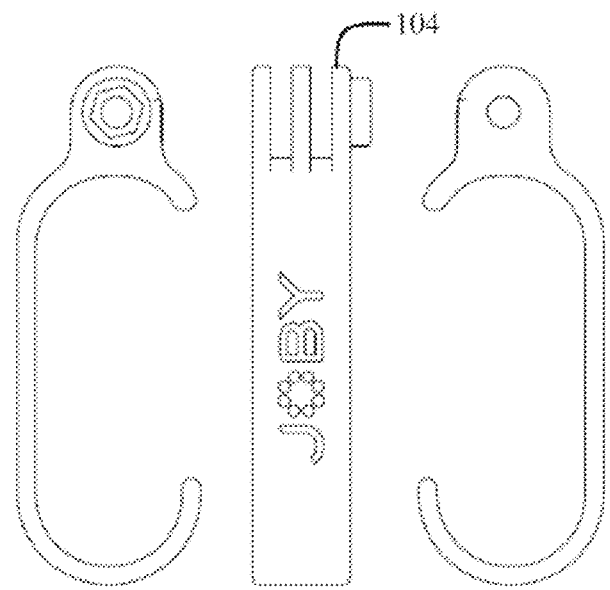
FIG. 20 illustrates a hand grip according to some embodiments of the present invention.
Figure 21:
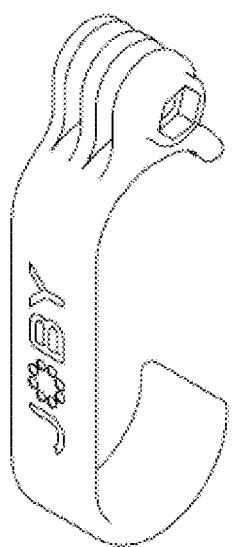
FIG. 21 illustrates a hand grip according to some embodiments of the present invention.
Figure 22:
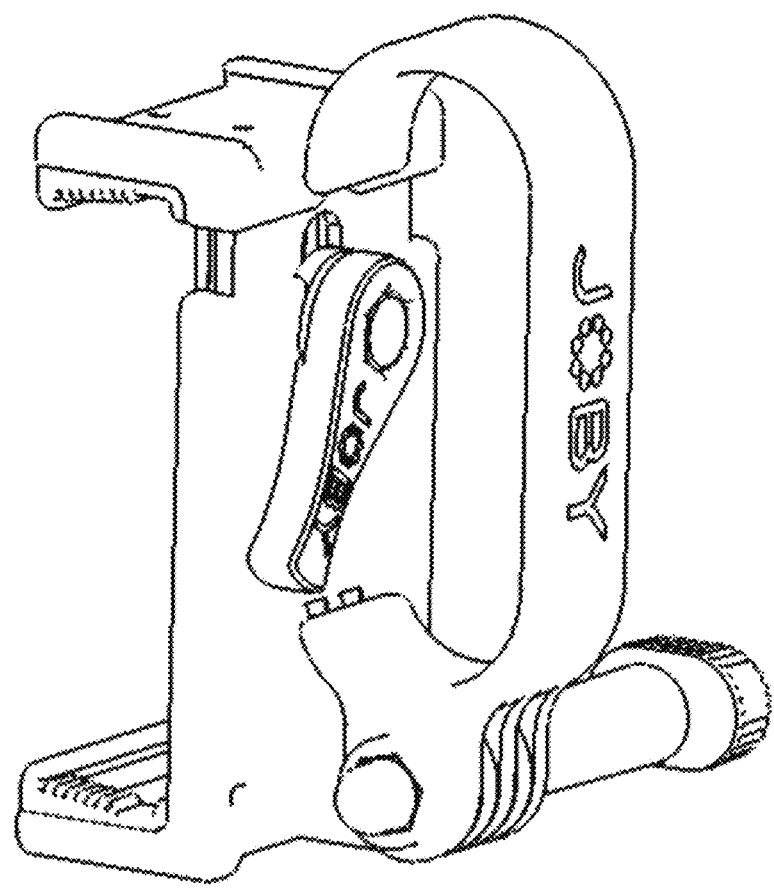
FIG. 22 illustrates a multi-configuration clip system with a hand grip according to some embodiments of the present invention.

FIGS. 19 and 20 illustrate a belt clip 111. The belt clip 111 has a belt loop 112 adapted to fasten the clamping system over the belt of a user. FIG. 21 illustrates the hand grip 103. FIG. 22 illustrates the assembly with a hand grip.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A multi-configuration clip system, said system comprising:
   a central clip portion, said central clip portion comprising:
      an adjustable length clip, said adjustable length clip adjustable along a first extension axis, said adjustable length clip adapted to hold a device in a first plane parallel to said first axis, said adjustable length clip comprising:
         a first piece with a first gripping end at a first end, said first gripping end perpendicular to said first extension axis and said first plane; and
         a sliding piece with a second gripping end at a top end, said second gripping end perpendicular to said first extension axis and said first plane, wherein said first piece has a first side facing said second gripping end and a second side facing away from said second gripping end, wherein said second gripping end has a first side facing said first gripping end and a second side facing away from said first gripping end, wherein said adjustable length clip comprises a wireless trigger mount on said second side of said second gripping end, wherein said wireless trigger mount comprises a recessed interface on the second side of said second gripping end; and
      a first locking mechanism adapted to lock the clip at a certain length along said first axis, wherein said first locking mechanism is adapted to clamp said first piece to said sliding piece, said first locking mechanism comprising:
         a clamp lock lever residing on a back surface of said first piece, said clamp lock lever comprising a clamp lever extension arm, and
         a threaded element, said threaded element extending through said first piece at a fixed location on said first piece, wherein said clamp lock lever is configured to rotate in a plane parallel to said first plane, thereby tightening said threaded element to firmly lock said first piece and said sliding piece together;
   a support portion, said support portion comprising two parallel tabs extending from the back surface of said first piece, said parallel tabs parallel to said first extension axis and perpendicular to said first plane, wherein said support portion extends from a back surface of said first piece below the rotation area of said clamp lock lever extension arm.

2. The multi-configuration clip system of claim 1 wherein said first piece and said sliding piece interlock and are adapted to slide relative to each other along said first extension axis and wherein said sliding piece slides along a front surface of said first piece.

3. The multi-configuration clip system of claim 2 wherein said sliding piece further comprises a slot parallel to said first extension axis configured to slide along said threaded element.

4. The multi-configuration clip system of claim 1 further comprising a wireless trigger mounted into said wireless trigger mount.

\* \* \* \* \*